US008893771B2

(12) United States Patent
Daly et al.

(10) Patent No.: US 8,893,771 B2
(45) Date of Patent: Nov. 25, 2014

(54) EFFICIENT SELF COOLING HEAT EXCHANGER

(75) Inventors: Phillip F. Daly, Palatine, IL (US); Kurt M. Vanden Bussche, Lake in the Hills, IL (US)

(73) Assignee: UOP LLC, Des Plaines, IL (US)

( * ) Notice: Subject to any disclaimer, the term of this patent is extended or adjusted under 35 U.S.C. 154(b) by 0 days.

(21) Appl. No.: 13/397,726

(22) Filed: Feb. 16, 2012

(65) Prior Publication Data
US 2012/0145369 A1 Jun. 14, 2012

Related U.S. Application Data

(62) Division of application No. 12/485,301, filed on Jun. 16, 2009, now Pat. No. 8,118,086.

(51) Int. Cl.
*F28F 13/00* (2006.01)

(52) U.S. Cl.
USPC .......................................... 165/135; 165/170

(58) Field of Classification Search
CPC ..................... F28D 1/0435; F28D 202/0061
USPC .................................................. 165/135, 170
See application file for complete search history.

(56) References Cited

U.S. PATENT DOCUMENTS

| 4,336,770 | A | 6/1982 | Kaneko |
| 4,488,134 | A | 12/1984 | Pfeiffer |
| 4,890,670 | A | 1/1990 | Schiessl |
| 5,660,917 | A * | 8/1997 | Fujimori et al. ........... 428/195.1 |
| 5,826,646 | A | 10/1998 | Bae |
| 6,062,300 | A * | 5/2000 | Wang et al. .................. 165/80.2 |
| 6,367,286 | B1 | 4/2002 | Price |
| 6,564,578 | B1 | 5/2003 | Fischer-Calderon |
| 6,742,358 | B2 | 6/2004 | Wilkinson |
| 6,763,680 | B2 | 7/2004 | Fischer |
| 6,886,362 | B2 | 5/2005 | Wilding |
| 6,959,492 | B1 | 11/2005 | Matsumoto |
| 7,198,037 | B2 | 4/2007 | Sayers |
| 7,637,112 | B2 | 12/2009 | Vanden Bussche |
| 8,118,086 | B2 | 2/2012 | Daly |
| 8,122,946 | B2 | 2/2012 | Daly |
| 8,555,954 | B2 * | 10/2013 | Daly et al. .................... 165/135 |
| 2003/0141043 | A1 | 7/2003 | Warburton |
| 2006/0137855 | A1 | 6/2006 | Daffron |
| 2008/0142204 | A1* | 6/2008 | Vanden Bussche et al. .. 165/167 |

(Continued)

FOREIGN PATENT DOCUMENTS

JP 2002518661 A 6/2002

OTHER PUBLICATIONS

International Preliminary Report on Patentability dated Dec. 29, 2011 for PCT/US2010/038457.

(Continued)

*Primary Examiner* — Brandon M Rosati
(74) *Attorney, Agent, or Firm* — Arthur E Gooding

(57) ABSTRACT

An inexpensive heat exchanger is disclosed, wherein the heat exchanger is made up of a plurality of plates and each plate has at least one channel defined in the plate. The plates are stacked and bonded together to form a block having conduits for carrying at least one fluid and where the exchanger includes an expansion device enclosed within the unit. The plates include construction to thermally insulate the expansion region from the heat exchange region to improve efficiency of the heat exchanger.

7 Claims, 2 Drawing Sheets

(56) References Cited

U.S. PATENT DOCUMENTS

2010/0314085 A1* 12/2010 Daly et al. ............... 165/168
2010/0314087 A1   12/2010 Daly
2012/0145366 A1    6/2012 Daly
2012/0145369 A1    6/2012 Daly
2014/0020874 A1*  1/2014 Daly et al. ............... 165/135

OTHER PUBLICATIONS

Restriction dated Oct. 13, 2011 for U.S. Appl. No. 12/485,284, filed Jun. 16, 2009.
Applicant Restriction-Election dated Nov. 1, 2011 for U.S. Appl. No. 12/485,284.
Office Action dated Nov. 9, 2011 for U.S. Appl. No. 12/485,284.
Applicant Amendment filed Feb. 9, 2012 for U.S. Appl. No. 12/485,284.
Final Office Action dated Feb. 29, 2012 for U.S. Appl. No. 12/485,284.
Applicant RCE dated May 29, 2012 for U.S. Appl. No. 12/485,284.
Applicant Amendment Accompanying RCE dated May 29, 2012 for U.S. Appl. No. 12/485,284.
Applicant Supplemental Amendment dated Jun. 5, 2012 for U.S. Appl. No. 12/485,283.
Office Action dated Sep. 20, 2012 for U.S. Appl. No. 12/485,284.
Applicant Amendment dated Dec. 13, 2013 for U.S. Appl. No. 12/485,284.
Final Office Action dated Jan. 9, 2013 for U.S. Appl. No. 12/485,284.
Interview Summary dated Apr. 22, 2013 for U.S. Appl. No. 12/485,284.
Applicant Amendment dated May 7, 2013 for U.S. Appl. No. 12/485,284.
Advisory Action dated May 14, 2013 for U.S. Appl. No. 12/485,284.
Applicant Restriction-Election dated Sep. 10, 2010 for U.S. Appl. No. 12/485,311.
Applicant Request for Reconsideration of Restriction dated Oct. 11, 2010 for U.S. Appl. No. 12/485,311.
Office Action dated Dec. 23, 2010 for U.S. Appl. No. 12/485,311.
Applicant Amendment After Non-Final Rejection dated Mar. 22, 2011 for U.S. Appl. No. 12/485,311.
Final Office Action dated Jun. 6, 2011 for U.S. Appl. No. 12/485,311.
Applicant Amendment Accompanying a Request for Continued Examination dated Sep. 2, 2011.
Notice of Allowance dated Oct. 31, 2011 for U.S. Appl. No. 12/485,311.
Restriction dated Mar. 14, 2013 for U.S. Appl. No. 13/397,716.
Applicant Restriction-Election dated Apr. 9, 2013 for U.S. Appl. No. 13/397,716.

* cited by examiner

EFFICIENT SELF COOLING HEAT EXCHANGER

CROSS-REFERENCE TO RELATED APPLICATIONS

This application is a Division of prior copending U.S. application Ser. No. 12/485,301, filed Jun. 16, 2009, the contents of which are hereby incorporated by reference in its entirety.

FIELD OF THE INVENTION

The present invention relates to the cooling of fluids through the self-cooling from the fluid. More particularly this invention goes to the cooling of a fluid to self-cool the fluid and to cool and, potentially, liquefy another fluid.

BACKGROUND OF THE INVENTION

The demands for natural gas have increased in recent years. The transport of natural gas is through pipelines or through the transportation on ships. Many areas where natural gas is located are remote in the sense that there are no convenient pipelines to readily transfer the natural gas to the market. Therefore natural gas is frequently transported by ship. The transport of natural gas on ships requires a means to reduce the volume and one method of reducing the volume is to liquefy the natural gas. The process of liquefaction requires cooling the gas to very low temperatures. There are several known methods of liquefying natural gas as can be found in U.S. Pat. No. 6,367,286; U.S. Pat. No. 6,564,578; U.S. Pat. No. 6,742,358; U.S. Pat. No. 6,763,680; and U.S. Pat. No. 6,886,362.

One of the methods is a cascade method using a number of shell and tube heat exchangers. Each of these shell and tube heat exchangers, is very large and very expensive, and presents problems of economics and feasibility for remote and smaller natural gas fields. It would be desirable to have a device for liquefying natural gas that is compact and relatively inexpensive to ship and use in remote locations, especially for natural gas fields found under the ocean floor, where collection and liquefaction of the natural gas can be performed on board a floating platform using a compact unit.

The most common commercial design of a heat exchanger for the cooling of natural gas is a spiral wound heat exchanger where the coolant cascades within a shell over spiral wound tubes carrying the gas to be cooled.

There is also an increasing demand for methods of cooling gases to condense them for transport or for separation purposes. Improvements over the current commercial design can include lower cost, lower weight, and provide a more compact structure as well as provide improved heat transfer characteristics.

SUMMARY OF THE INVENTION

The present invention comprises a heat exchanger made up of one or more plates where each plate has at least one channel etched, or milled, or otherwise formed in the plate. The channels each have an inlet and an outlet for admitting and withdrawing a cooling fluid. The channels each have an expansion device positioned within the channel, where the cooling fluid is expanded and provides self-cooling for the cooling fluid. The plates in the heat exchanger are bonded to form a cooling block, and can be used as a heat sink for devices external to the heat exchanger. The invention is designed to improve the efficiency of the heat exchanger and has a heat exchange region and an expansion region, wherein the expansion device is positioned. The expansion of the cooling fluid is adversely affected by the heat flow from the heat exchange region and therefore the heat exchange region and expansion region are separated by a thermally insulating region. The thermally insulating region includes an opening, or hole, in the plates that is large enough to reduce the overall thermal conductivity of the thermally insulating region to less than 0.2 W/m-K.

Other objects, advantages and applications of the present invention will become apparent to those skilled in the art from the following detailed description and drawings.

DETAILED DESCRIPTION OF THE INVENTION

The use of liquefied natural gas (LNG) is increasing, as fuel and a means of transporting natural gas from remote sites having natural gas, without a nearby gas pipeline, to more distant areas where the natural gas is consumed. Natural gas is typically recovered from gas wells that have been drilled and is in the gas phase at high pressure. The high pressure gas is then treated and passed to a pipeline for transport. However, there are an increasing number of natural gas fields that are in remote locations relative to natural gas pipelines. The present invention is directed to a heat exchanger for cooling the natural gas at the gas wells. By providing an inexpensive heat exchanger for cooling and liquefying natural gas in remote locations, natural gas can be recovered on site and transported as LNG, rather than requiring a natural gas pipeline, or transporting the gas at very high pressures. In addition, the present invention can be used as a means for cooling other materials, such as providing for a cooling device to cool electronics or other devices that generate heat and need external cooling.

The efficiency of the heat exchanger is affected by the heat transfer to the expansion device where a substantially adiabatic expansion is affected. The present invention is designed to reduce the undesirable heat flow from the heat transfer region to the expansion region of the heat exchanger. The creation of a barrier region to limit heat flow to the expansion region improves the thermodynamic efficiency of the expansion of the cooling fluid.

Figure 1:
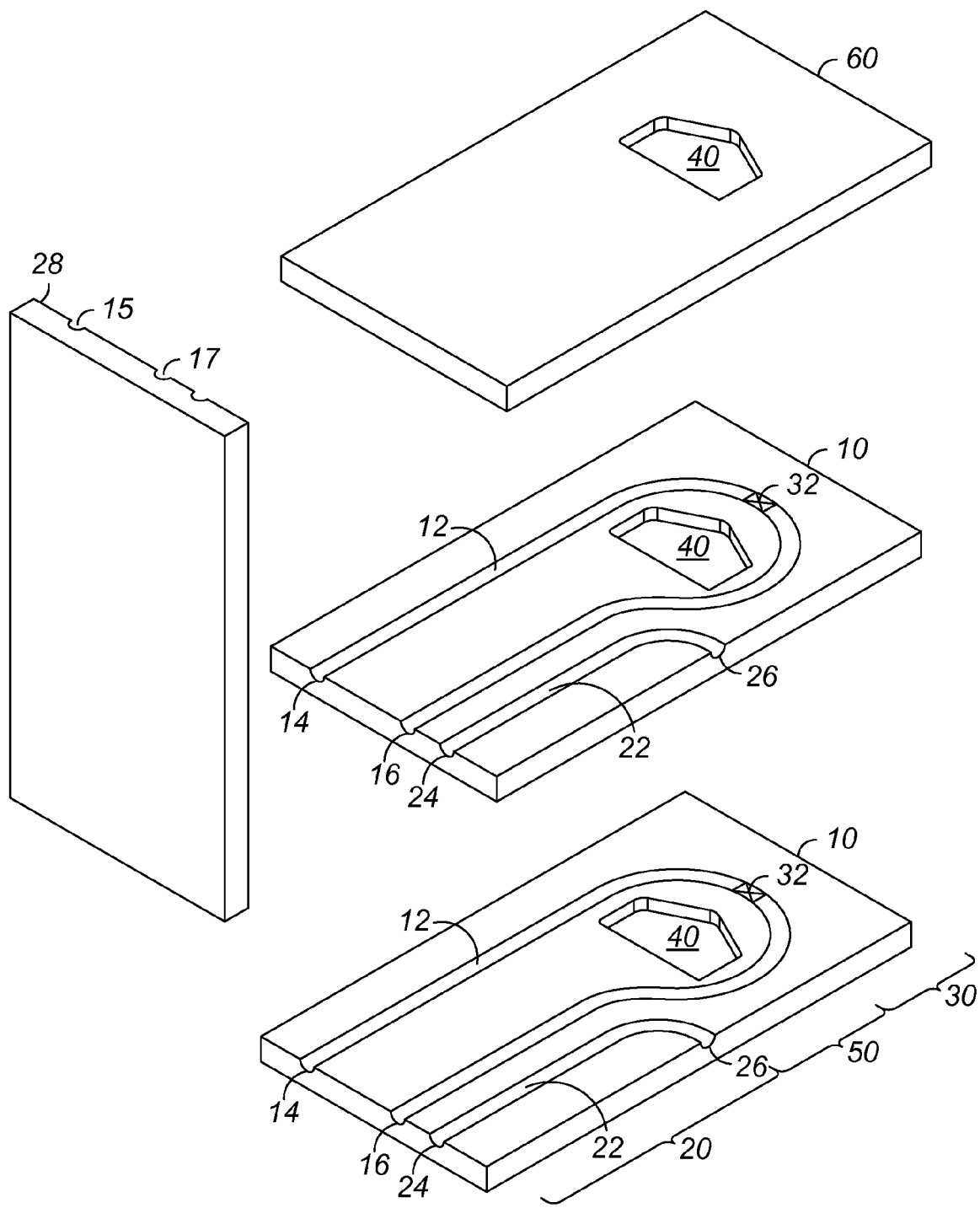
FIG. 1 is a schematic of a first embodiment comprising a plurality of plates, with each plate having cooling channels defined therein.

The present invention comprises a heat exchanger, as shown in FIG. 1, comprising at least one plate 10 having a first channel 12 defined therein. The first channel 12 has an inlet 14 and an outlet 16, and the channel 12 passes through a heat exchange region 20 and an expansion region 30. The heat exchanger further includes an expansion device 32 disposed within the first channel 12 section that is located in the expansion region 30. The expansion region 30 is separated from the heat transfer region 20 by a region 50 of low thermal conductivity providing some thermal insulation between the heat transfer region 20 and the expansion region 30. A cover plate 60 can be added to the heat exchanger to enclose the channel 12 carrying the cooling fluid.

The positioning of the expansion device 32 within the channel provides better flow distribution of the cooling fluid.

The flow is completely contained within the heat exchanger, which is of particular importance when the cooling fluid provides for two phase flow after expansion and multiple channels or plates in parallel. Conventionally, the expanded fluid is passed to a chamber, where the liquid can separate from the vapor, upon which liquid and vapor are separately re-introduced into the channel. The present invention avoids this separation, overcoming the inefficiencies associated with uneven distribution of the gas and liquid during re-introduction. This advantage is particularly prominent in cases where the device is operating while in motion, as on board a ship, as the separation of gas and liquid in a chamber becomes more difficult to accomplish under those conditions. In addition, no header is needed and no additional equipment is added outside the heat exchanger. An additional advantage is the removal of the need for a pressure test, as is required with an expansion device outside of the heat exchanger. Furthermore, in cases where the heat exchanger is used in cryogenic service, the absence of external welds may avoid the need for a nitrogen sweep of the cold box in which the heat exchanger is disposed, further reducing the cost of the operation.

The plates have channels etched, milled, pressed, stamped, inflated, or by other methods known in the art, into them for the transport of coolant and fluid to be cooled. When the plates are bonded together, the channels are covered and form conduits through which fluids can flow. The bonding method will depend on the materials of construction, such as with aluminum plates, bonding involves brazing the aluminum plates together. With steel, diffusion bonding or welding can be performed to bond the steel plates together. Other means of bonding plates are known to those skilled in the art.

The low thermal conductivity region of the heat exchanger includes an opening 40 in the plate 10 that passes through the plate. The opening 40 can be sized and shaped to minimize heat flow from the heat transfer region 20 to the expansion region 30. The heat transfer is a composite of a cross section of the portion of the plate 10 connecting the heat transfer region 20 with the expansion region 30 and the opening. A weighted, or composite or effective, thermal conductivity, for the region 50 of low thermal conductivity, can be computed according to eqn. 1:

$$k_{comp} = \frac{(k_{plate} * A_{plate} + k_{opening} * A_{opening})}{(A_{plate} + A_{opening})} \quad \text{Eqn. 1}$$

Where $k_{plate}$ and $k_{opening}$ are the conductivities of the respective portions of the heat exchanger and $A_{plate}$ and $A_{opening}$ are the respective cross-sectional areas in the region separating the heat exchanger region from the expansion region, wherein the cross-sectional areas are measured essentially perpendicularly to the heat flux between the heat exchange region 20 and the expansion region 30.

The weighted average thermal conductivity is dependent on the size of the opening 40 relative to the regions of the plate proximate to the opening 40 and between the heat exchange region 20 and the expansion region 30, which is the thermally insulating region. It is preferred to have a weighted average thermal conductivity of less than 25% of the plate conductivity, and more preferred weighted average thermal conductivity of less than 15% of the plate conductivity, in the thermally insulating region.

The thermal insulation region 50 can include a hole 40 filled with a gas. The gas can be air and will provide a low thermal conductivity, but if the hole is covered to provide a sealed hole, another gas having a low thermal conductivity can be injected into the hole 40. The hole 40 preferably passes through each plate in the heat exchanger, including the cover plate 60. In an embodiment, the hole can be filled with an insulating material, or any suitable material having a low thermal conductivity, and providing for a means to reduce convection cells in the hole 40. The selection of insulation material for filling the hole 40 should be a material suitable for the temperature range of operation, and providing at least a thermal conductivity of less than 0.1 W/m-K for the operational temperature range. Preferably the thermal conductivity of the insulating material is less than 0.05 W/m-K. Suitable materials for different low temperature ranges include perlite, cellular glass insulation, polyurethane insulation, polyisocyanurate insulation, fiberglass, polystyrene and other elastomeric foams. Some of these insulating materials are appropriate for temperatures near or below cryogenic temperature ranges.

The heat exchanger can include a plurality of plates 10 stacked to form an array of cooling plates that are bonded together and can be used as a heat sink, or cooling block, for conductive cooling. An example of usage as a conductive cooling block is with electronic components that generate a substantial amount of heat and the components need to be cooled to operate continuously. The heat exchanger can include a manifold 28 having a manifold inlet channel 15 in fluid communication with the channel inlets 14, and a manifold outlet channel 17 in fluid communication with the channel outlets 16.

In one embodiment, the heat exchanger can include a second channel 22 defined in each plate 10. The second channel 22 is defined in the heat exchange region 20 and includes an inlet 24 and an outlet 26. The second channel 22 is in fluid isolation from the first channel 12 to provide cooling of a second fluid by the first fluid. The fluid in the second channel 22 is cooled along with the self-cooling of the cooling fluid. This embodiment further includes a manifold second inlet channel in fluid communication with each second channel inlet 24, and a manifold second outlet channel in fluid communication with each second channel outlet 26. Variations include multiple manifolds, where each manifold includes a channel, or where some of the manifolds can include multiple channels for distributing and collecting the fluids.

In an optional design, the heat exchanger can provide for coolant access through the cover plate 60 rather than a manifold. With a cover plate 60 providing access for the coolant and the fluid to be cooled, the cover plate 60 includes a first channel inlet port in fluid communication with each first channel inlet, and a first channel outlet port in fluid communication with each first channel outlet. This design includes first channel inlets that pass through each plate 10 to provide the fluid communication with the first channel inlet port. In addition, the first channel outlets pass through each plate 10 to provide fluid communication to the first channel outlet port.

The cover plate can, additionally, provide a second channel inlet port in fluid communication with each second channel inlet, and a second channel outlet port in fluid communication with each second channel outlet. In this design, the second channel inlets pass through each plate, and the second channel outlets pass through each plate to provide the necessary fluid communication.

Figure 2:
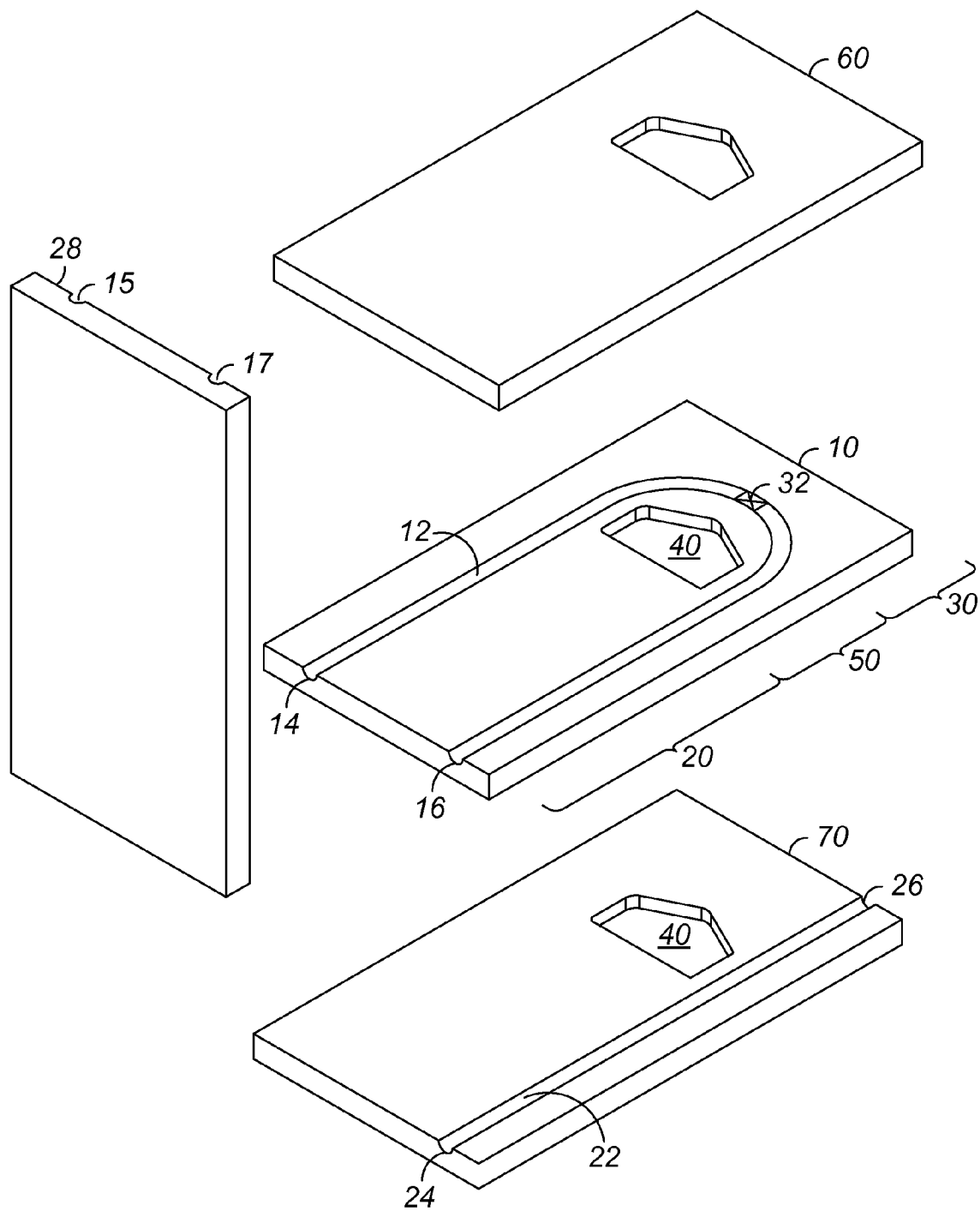
FIG. 2 is a schematic of a second embodiment comprising a plurality of pairs of plates, with alternate plates comprising a plate for carrying a coolant and a plate for carrying a fluid to be cooled.

The present invention also provides for the use of multiple plates for heat transfer. One example is the use of multiple pairs of plates, wherein the first plate provides for the coolant, and the second plate provides for the fluid to be cooled. This enables the use of longer channels having sinuous paths and longer contact lengths for heat transfer. An example of this embodiment can be seen in FIG. 2, where the heat exchanger comprises a plurality of first plates 10, and second plates 70, where the plates 10 and 70 are stacked in an alternating sequence, first plate 10, second plate 70, first plate 10, second plate 70, etc.

The first plate 10 includes a first channel 12 defined therein and having a first channel inlet 14 and a first channel outlet 16. The first plate 10 has three regions, a heat exchange region 20, an expansion region 30 and an insulation region 50. The insulation region is defined as the region having a reduced thermal conductivity to restrict the heat flow from the heat exchange region 20 to the expansion region 30. The insulation region 50 includes an opening 40 in the plate 10 to provide for reduced heat flow between the heat exchange region 20 and the expansion region 30, and the opening 40 provides for a space filled with gas, such as air that has a low thermal conductivity. The space can also be filled with a low conductivity material to reduce convection of gas within the opening 40.

The first channel 12 has three sections, a first section for carrying the cooling fluid prior to expansion in the heat exchange region 20, a second section in the expansion region 30, and a third section for carrying the expanded cooling fluid in the heat exchange region 20. The expansion region 30 includes the second section of the first channel 12 and has an expansion device 32 disposed within the first channel 12 located within the expansion region 30.

The second plate 70 includes a second channel 22 defined in the second plate 70 and having a second channel inlet 24 and a second channel outlet 26. The second plate 70 includes an opening 42 that is aligned with the opening 40 in the first plate 10. The preferred embodiment is for the second channel 22 within the second plate 70 to be substantially parallel to the third section of the first channel 12, but is not limited to that region. The opening 40 in the second plates 70 facilitates thermally insulating the expansion section 30 of the first plates 10 when the first 10 and second 70 plates are stacked in an alternating sequence. It is preferred to have the thermal conductivity for the insulating region 50 to be less than 0.2 W/m-K. This can be accomplished through keeping the thermal conductivity of the opening 40 to a low value, such as less than 0.1 W/m-K, and preferably less than 0.05 W/m-K. The opening can be filled with a low thermal conductivity gas or an insulating material having a low thermal conductivity.

While the invention has been described with what are presently considered the preferred embodiments, it is to be understood that the invention is not limited to the disclosed embodiments, but it is intended to cover various modifications and equivalent arrangements included within the scope of the appended claims.

The invention claimed is:

1. A heat exchanger comprising:
at least one first plate of a set of first plates each having a first channel defined therein having an inlet and an outlet, wherein the plate is divided into a heat exchange region and an expansion region, wherein the channel passes through a heat exchange region and an expansion region, and wherein the first channel has a first section in the heat exchange region, a second section in the expansion region, and a third section in the heat exchange region;
at least one second plate of a set of second plates each having a second channel defined in the second plate, wherein the second channel is defined in the heat exchange region, and wherein the second channel is substantially parallel to the third section of the first channel in the heat exchange region, and extends the entire length of the second plate; wherein the first and second set of plates are stacked in an alternating arrangement; and
an expansion device disposed in the second section of the first channel located in the expansion region, and the second section of the first channel traverses across the expansion region and where one end of the second section of the first channel is in fluid communication with the first section of the first channel and the other end of the second section of the first channel is in fluid communication with the third section of the first channel, wherein the expansion region is separated from the heat exchange region by a region of thermal insulation that provides a lower weighted average thermal conductivity, wherein the region of thermal insulation is a section of the plate having an open space, and, wherein the heat exchanger provides for self-cooling of the fluid in the heat exchanger.

2. The heat exchanger of claim 1 further comprising at least one manifold having a manifold first inlet channel in fluid communication with each first channel inlet, a manifold first outlet channel in fluid communication with each first channel outlet, a manifold second inlet channel in fluid communication with each second channel inlet, and a manifold second outlet channel in fluid communication with each second channel outlet.

3. The heat exchanger of claim 1 wherein the opening is filled with an insulation material.

4. The heat exchanger of claim 3 wherein the insulation material has a thermal conductivity of less than 0.1 W/m-K.

5. The heat exchanger of claim 3 wherein the insulation material is selected from the group consisting of perlite, cellular glass insulation, polyurethane insulation, polyisocyanurate insulation, fiberglass, polystyrene, elastomeric foams, and mixtures thereof.

6. The heat exchanger of claim 1 wherein the opening is filled with a low conductivity gas.

7. The heat exchanger of claim 1 further comprising at least one manifold having a manifold first inlet channel in fluid communication with each first channel inlet, a manifold first outlet channel in fluid communication with each first channel outlet, a manifold second inlet channel in fluid communication with each second channel inlet, and a manifold second channel outlet in fluid communication with each second channel outlet.

* * * * *